US007229899B2

(12) United States Patent
Moriceau et al.

(10) Patent No.: US 7,229,899 B2
(45) Date of Patent: *Jun. 12, 2007

(54) PROCESS FOR THE TRANSFER OF A THIN FILM

(75) Inventors: Hubert Moriceau, Saint Egrève (FR); Michel Bruel, Veurey (FR); Bernard Aspar, Rives (FR); Christophe Maleville, La Terrase (FR)

(73) Assignee: Commissariat a l'Energie Atomique, Paris (FR)

( * ) Notice: Subject to any disclaimer, the term of this patent is extended or adjusted under 35 U.S.C. 154(b) by 276 days.

This patent is subject to a terminal disclaimer.

(21) Appl. No.: 10/667,707

(22) Filed: Sep. 22, 2003

(65) Prior Publication Data

US 2004/0058555 A1    Mar. 25, 2004

Related U.S. Application Data

(63) Continuation of application No. 09/380,322, filed as application No. PCT/FR98/02904 on Dec. 29, 1998, now Pat. No. 6,756,286.

(30) Foreign Application Priority Data

Dec. 30, 1997 (FR) .................................. 97 16696

(51) Int. Cl.
*H01L 21/30* (2006.01)

(52) U.S. Cl. ................ 438/458; 438/45; 438/113; 438/459; 438/460

(58) Field of Classification Search .................. 438/45, 438/113, 458–460
See application file for complete search history.

(56) References Cited

U.S. PATENT DOCUMENTS 4,028,149 A  *  6/1977  Deines et al. .................. 117/95

(Continued)

FOREIGN PATENT DOCUMENTS

EP          0 410 679 A1        1/1991

(Continued)

OTHER PUBLICATIONS

"Low Temperature Si Layer Splitting" Tong et al., Proceedings 1997 IEEE International SOI Conference, Oct. 1997, pp. 126-127.

(Continued)

*Primary Examiner*—Shamim Ahmed
(74) *Attorney, Agent, or Firm*—Brinks Hofer Gilson & Lione

(57) ABSTRACT

A process for transferring a thin film includes forming a layer of inclusions to create traps for gaseous compounds. The inclusions can be in the form of one or more implanted regions that function as confinement layers configured to trap implanted species. Further, the inclusions can be in the form of one or more layers deposited by a chemical vapor deposition, epitaxial growth, ion sputtering, or a stressed region or layer formed by any of the aforementioned processes. The inclusions can also be a region formed by heat treatment of an initial support or by heat treatment of a layer formed by any of the aforementioned processes, or by etching cavities in a layer. In a subsequent step, gaseous compounds are introduced into the layer of inclusions to form micro-cavities that form a fracture plane along which the thin film can be separated from a remainder of the substrate.

26 Claims, 4 Drawing Sheets

U.S. PATENT DOCUMENTS

| | | | |
|---|---|---|---|
| 4,254,590 A | | 3/1981 | Eisele et al. |
| 5,242,863 A | * | 9/1993 | Xiang-Zheng et al. ......... 438/53 |
| 5,300,788 A | | 4/1994 | Fan et al. |
| 5,374,564 A | | 12/1994 | Bruel ........................... 437/24 |
| 5,400,458 A | | 3/1995 | Rambosek |
| 5,405,802 A | * | 4/1995 | Yamagata et al. ........... 438/459 |
| 5,559,043 A | | 9/1996 | Bruel ........................... 437/24 |
| 5,811,348 A | | 9/1998 | Matsushita et al. |
| 5,854,123 A | | 12/1998 | Sato et al. .................. 438/507 |
| 5,877,070 A | | 3/1999 | Goesele et al. |
| 5,909,627 A | | 6/1999 | Egloff |
| 5,920,764 A | | 7/1999 | Hanson et al. ................. 438/4 |
| 5,953,622 A | | 9/1999 | Lee et al. |
| 5,966,620 A | | 10/1999 | Sakaguchi et al. ........... 438/455 |
| 5,993,677 A | | 11/1999 | Biasse et al. ................. 216/36 |
| 5,994,207 A | | 11/1999 | Henley et al. |
| 6,013,563 A | | 1/2000 | Henley et al. ............... 438/458 |
| 6,020,252 A | | 2/2000 | Aspar et al. ................. 438/458 |
| 6,048,411 A | | 4/2000 | Henley et al. |
| 6,054,370 A | | 4/2000 | Doyle |
| 6,071,795 A | | 6/2000 | Cheung et al. .............. 438/458 |
| 6,103,597 A | | 8/2000 | Aspar et al. ................. 438/458 |
| 6,103,599 A | | 8/2000 | Henley et al. ............... 438/459 |
| 6,127,199 A | | 10/2000 | Inoue |
| 6,146,979 A | | 11/2000 | Henley et al. |
| 6,150,239 A | | 11/2000 | Goesele et al. |
| 6,190,998 B1 | | 2/2001 | Bruel et al. .................. 438/407 |
| 6,225,190 B1 | | 5/2001 | Bruel et al. .................. 438/458 |
| 6,225,192 B1 | | 5/2001 | Aspar et al. |
| 6,271,101 B1 | | 8/2001 | Fukunaga |
| 6,303,468 B1 | | 10/2001 | Aspar et al. |
| 6,323,108 B1 | | 11/2001 | Kub et al. |
| 6,323,109 B1 | | 11/2001 | Okonogi ..................... 438/459 |
| 6,346,458 B1 | | 2/2002 | Bower |
| 6,362,077 B1 | | 3/2002 | Aspar et al. |
| 6,513,564 B2 | | 2/2003 | Bryan et al. |
| 6,534,380 B1 | | 3/2003 | Yamauchi et al. |
| 6,593,212 B1 | | 7/2003 | Kub et al. |
| 6,607,969 B1 | | 8/2003 | Kub et al. |
| 6,727,549 B1 | | 4/2004 | Doyle |
| 6,756,286 B1 | * | 6/2004 | Moriceau et al. ........... 438/459 |
| 6,770,507 B2 | | 8/2004 | Abe et al. |
| 6,946,365 B2 | | 9/2005 | Aspar et al. |
| 2002/0025604 A1 | | 2/2002 | Tiwari |
| 2002/0153563 A1 | | 10/2002 | Ogura |
| 2002/0185684 A1 | | 12/2002 | Campbell et al. |
| 2003/0077885 A1 | | 4/2003 | Aspar et al. |
| 2003/0134489 A1 | | 7/2003 | Schwarzenbach et al. |
| 2003/0162367 A1 | | 8/2003 | Roche |
| 2003/0199105 A1 | | 10/2003 | Kub et al. |
| 2004/0144487 A1 | | 7/2004 | Martinez et al. |

FOREIGN PATENT DOCUMENTS

| | | |
|---|---|---|
| EP | 533551 | 3/1993 |
| EP | 0 293 049 B1 | 9/1993 |
| EP | 717437 | 6/1996 |
| EP | 0 767 486 A2 | 4/1997 |
| EP | 0 793 263 A2 | 9/1997 |
| EP | 801419 | 10/1997 |
| EP | 0 807 970 A1 | 11/1997 |
| EP | 0917193 | 5/1999 |
| EP | 0 938 129 A1 | 8/1999 |
| EP | 0 902 843 B1 | 3/2000 |
| EP | 0 994 503 A1 | 4/2000 |
| EP | 1 050 901 A2 | 11/2000 |
| EP | 0 786 801 B1 | 6/2003 |
| EP | 0 925 888 B1 | 11/2004 |
| EP | 1 014 452 B1 | 5/2006 |
| FR | 2 681 472 A1 | 3/1993 |
| FR | 2 748 850 A1 | 11/1997 |
| FR | 2 748 851 A1 | 11/1997 |
| FR | 2 758 907 A1 | 7/1998 |
| FR | 2 767 416 A1 | 2/1999 |
| FR | 2 773 261 A1 | 7/1999 |
| FR | 2 774 510 A1 | 8/1999 |
| FR | 2 781 925 A1 | 2/2000 |
| FR | 2 796 491 A1 | 1/2001 |
| FR | 2 797 347 A1 | 2/2001 |
| FR | 2 809 867 A1 | 12/2001 |
| FR | 2 847 075 A1 | 5/2004 |
| JP | 62265717 | 11/1987 |
| JP | 01004013 | 9/1989 |
| JP | 07-254690 | 10/1995 |
| JP | 7302889 | 11/1995 |
| JP | 09-213594 | 8/1997 |
| JP | 09-307719 | 11/1997 |
| JP | 11045862 | 2/1999 |
| JP | 11074208 | 3/1999 |
| JP | 11087668 | 3/1999 |
| JP | 11-145436 | 5/1999 |
| JP | 11233449 | 8/1999 |
| WO | WO 99/08316 A1 | 2/1999 |
| WO | WO 99/35674 A1 | 7/1999 |
| WO | WO 99/39378 A1 | 8/1999 |
| WO | WO/0048238 A1 | 8/2000 |
| WO | WO 00/63965 A1 | 10/2000 |
| WO | WO 01/11930 A2 | 2/2001 |
| WO | WO 02/47156 | 6/2002 |
| WO | WO 02/083387 A1 | 10/2002 |
| WO | WO 03/013815 A1 | 2/2003 |

OTHER PUBLICATIONS

Agarwal et al "Efficient production of Silicon-on-insulator films by co-implatation of $HE^+$ with $H^+$", *Applied Physics Letter, American Insitute of Physics*, vol. 72, No. 9, Mar. 1998, pp. 1086-1088.

Bruel et al., [vol. 99-1] Meeting Abstract No. 333, "Single-crystal semiconductor layer delamination and transfer through hydrogen implatation," *The 195th Metting of The Electrochemical Society*, May 2-6, 1999, Seattle, Washington.

Camperi-Ginestet et al., "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123-1126.

Cerofolini et al. "Ultradense Gas Bubbles in Hydrogen-or-Helium-Implated (or Co-implanted) Silicon", *Materials Science and Engineering*, B71, 2000, pp. 196-202.

Demeester, et al., "Epitaxial Lift-off and its Applications", *Semicond. Sci. Technol.*, vol. 8, 1993, pp. 1124-1135.

DiCioccio et al., "III-V layer transfer onto silicon and applications", *Phys. Stat. Sol. (a)*, vol. 202, No. 4., 2005, pp. 509-515/DOI 10.1002/pssa. 200460411.

Feijoo et al., "Prestressing of Bonded Wafers", vol. 92-7 1992 pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Hamaguchi, et al., "Novel LSI/SOI Wafer Fabrication Using Device Layer Transfer Technique" *Proc. IEDM*, 1985, pp. 688-691.

Henttinen et al. "Mechanically induced Si Layer Transfer in Hydrogen-Implanted Si-Wafers", *American Institute of Physics*, vol. 76, No. 17, Apr. 2000, pp. 2370-2372.

Kucheyev et al., "Ion implantation into GaN", *Materials Science and Engineering*, 33, 2001, pp. 51-107.

Liu et al., "Ion implatation in GaN at liquid-nitrogen temperature: Structural characteristics and amorphization," *Physical Review B of The American Physical Society*, vol. 57, No. 4, 1988, pp. 2530-2535.

Moriceau et al., [vol. 99-1] Meeting Abstract No. 405, "A New Characterization Process Used to Qualify SOI Films," *The 195th Meeting of The Electrochemical Society*, May 2-6, 1999, Seattle, Washington.

Pollentier et al., "Fabrication of High-Radiance LEDs by Epitaxial Lift-off" *SPIE*, vol 1361, 1990, pp. 1056-1062.

Suzuki et al., "High-Speed and Low Power n$^+$-p$^+$ Doubel-Gate SOI CMOS", *IEICE Trans. Electron.*, vol. E78-C, No. 4, Apr. 1995, pp. 360-367.

Timoshenko, S., "Analysis of Bi-Metal Thermostats", *J.Opt.Soc. Am.*, 11, 1925, pp. 233-256.

Wong et al., "Integration of GaN Thin Films with Dissimilar Substrate Materials by Pd-In Metal Bonding and Laser Lift-off", *Journal of Electronic Materials*, vol. 28, No. 12, 1999, pp. 1409-1413.

Yun et al., "Fractional Implatation Area Effects on Patterned Ion-Cut Silicon Layer Transfer," Dept. of Electrical Eng. And Computer Sciences, University of California, Berkeley, CA 94720, USA, 1999 IEEE International SOI Conference, Oct. 1999, pp. 129-30.

Yun et al., "Thermal and Mechanical Separations of Silicon Layers from Hydrogen Pattern-Implated Wafers," Journal of Electronics Materials, vol. No. 36, No. 8 2001.

\* cited by examiner

PROCESS FOR THE TRANSFER OF A THIN FILM

CROSS REFERENCE TO RELATED APPLICATION

This application is a continuation of U.S. application Ser. No. 09/380,322, filed Nov. 22, 1999, now U.S. Pat. No. 6,756,286, which is a section 371 application of PCT/FR98/02904, filed Dec. 29, 1998.

TECHNICAL DOMAIN

This invention relates to a process for transferring a thin film of solid material. In particular, this process can be used to transfer a thin film of solid material onto a support composed of a solid material of the same nature or a different nature.

STATE OF PRIOR ART

Document FR-A-2 681 472 (corresponding to patent U.S. Pat. No. 5,374,564) describes a process for making thin films of semiconducting material. This document discloses that the implantation of a rare gas or hydrogen into a substrate made of a semiconducting material can cause the formation of a layer of micro-cavities or micro-bubbles (also denoted "platelets") at a depth close to the average projected range (Rp) of the implanted ions. The concept of micro-cavities obviously includes micro-cracks. The thickness of the layer of micro-cavities is determined by the implantation conditions. If this substrate is put into intimate contact with a stiffener through its implanted face and a heat treatment is applied at a sufficiently high temperature, an interaction occurs between the micro-cavities or the micro-bubbles separating the semiconducting substrate into two parts, firstly a thin semiconducting film bonding to the stiffener, and secondly the remainder that bonds to the semiconducting substrate. Separation takes place at the location of the micro-cavities or micro-bubbles. The heat treatment is such that the interaction between the micro-bubbles or micro-cavities created by the implantation induces a separation between the thin film and the remainder of the substrate. Therefore a thin film is transferred from an initial substrate to a stiffener used as a support for this thin film.

This process can also be applied to the manufacture of a thin film of a crystalline or non-crystalline solid material other than a semiconducting material (a conducting or dielectric material).

If the thin film delimited in the substrate is sufficiently stiff in itself (due to its thickness or due to its mechanical properties) a self-supported film may be obtained after the transfer annealing. This is described in document FR-A-2 738 671.

Document EP-A-0 767 486 proposes an improvement to the process disclosed in document FR-A-2 681 472 mentioned above. According to document EP-A-0 767 486 (see column 8), the process disclosed by document FR-A-2 681 472 has the following disadvantages. The choice of the thickness of the film to be transferred is a weak degree of freedom. The thickness of the film to be transferred (corresponding to Rp) and the conditions for separation of the film from the initial substrate are inter-related. The planeness of the film surface obtained after separation is unsatisfactory, and there is no way of maintaining a uniform thickness of a thin film during the transfer. The improvement proposed by document EP-A-0 767 486 consists of performing the ion implantation at depth Rp in a porous layer of silicon formed on the surface of a silicon substrate. This ion implantation causes an increase in the porosity (pore density) to the extent that micro-cavities appear in the walls of the pores of the porous layer. This layer is then considered as being a fine porous structure. Under some implantation conditions, separation is caused in this fine porous layer in accordance with the mechanism described in document FR-A-2 681 472. Therefore, there are two zone effects, firstly due to a zone of pores created by a porous silicon generation step, and secondly due to a zone of cavities generated between the pores in the small perfect silicon zones as in the process according to document FR-A-2 681 472. Therefore, the proposed improvement consists of using a porous layer to obtain a layer with a well-controlled uniform thickness after separation.

The process disclosed by document EP-A-0 767 486 recommends the formation of porous silicon (the order of the porosity is a percentage equal to several tens), which is equivalent to removing silicon or material from the separation zone which causes weakening of the material.

A more significant improvement to the process disclosed by document FR-A-2 681 472 would be to reduce thickness of the micro-cavities layer obtained by ion implantation. This is what is proposed in this invention.

BRIEF SUMMARY

The improvement proposed by this invention is made possible due to creation of an inclusion or a set of inclusions in the initial substrate material, in order to confine gaseous compounds introduced during the ion implantation step. An inclusion is a volume of material for which the properties are not the same as the properties of the substrate material from which one or more thin films are to be transferred. Inclusions may be in the form of a layer that extends approximately parallel to the surface through which the implantation is done. These volumes may have a variety of shapes and their dimensions may vary from a few tens of nanometers to several hundreds of micrometers. For example, the inclusions can be in the form of one or more implanted regions that function as confinement layers configured to trap implanted species. Further, the inclusions can be in the form of one or more layers deposited by a chemical vapor deposition process, epitaxial growth process, ion sputtering process. Inclusions can also be in the form of a stressed region or layer formed by any of the aforementioned processes, or a layer in which cavities have been etched. Still further, inclusions can be a region formed by heat treatment of an initial support or by heat treatment of a layer formed by any of the aforementioned processes.

The role of these inclusions is to act as traps for implanted gaseous compounds. The radius of action of these traps depends on the nature of the inclusions made. In this case, there is no removed material, as is the case for the process disclosed by document EP-A-0 767 486.

The process according to this invention comprises a preliminary step that consists of forming inclusions in the initial substrate material. A subsequent step consists of implanting gaseous compounds (rare gas or other) in this material. The presence of inclusions formed during the previous step causes confinement of implanted gaseous compounds. The efficiency of these inclusions is related to their power to confine gaseous compounds.

Inclusions may be formed close to a perfectly controllable depth. Their presence then introduces confinement of implanted compounds within a disturbed layer which is much thinner than can be obtained using the process according to known art. This produces several advantages. The implanted gaseous compounds are preferably trapped at the level and/or within the zone influenced by these inclusions, called the neighborhood of these inclusions. This precise position means that a separation (transfer) fracture can be induced at and/or near the inclusions. The result is a relatively low surface roughness at the fracture. Furthermore, due to the confinement power, this process enables the use of low implanted doses necessary for the fracture. Finally, the confinement effect due to the presence of inclusions can reduce the thermal budget necessary for the fracture, to the extent that nucleation and growth of cavities leading to fracture is encouraged. The advantage is obvious for transferring film structures in which there is a limit on the maximum temperature rise. For example, one case is the heterogeneous gluing of materials with coefficients of expansion that differ by more than 10%.

Therefore, the purpose of the invention is a process for the transfer of at least one thin film of solid material delimited in an initial substrate, characterized in that it comprises the following steps:

a step in which a layer of inclusions is formed in the initial substrate at a depth corresponding to the required thickness of the thin film, these inclusions being designed to form traps for gaseous compounds which will subsequently be implanted;

a subsequent step for implantation of the said gaseous compounds, in a manner to convey the gaseous compounds into the layer of inclusions, the dose of implanted gaseous compounds being sufficient to cause the formation of micro-cavities likely to form a fracture plane along which the thin film can be separated from the remainder of the substrate.

The step of implanting gaseous compounds can be carried out with an implantation energy of these gaseous compounds that is such that their mean depth of penetration into the substrate corresponds to the depth of the layer of inclusions. It can also be carried out with an implantation energy of these gaseous compounds that is such that their mean depth of penetration into the substrate is close to the layer of inclusions, this implantation being associated with a diffusion heat treatment to allow the migration of the implanted compounds to the layer of inclusions.

The implantation step may be performed from one or several gaseous compounds implanted either simultaneously or in sequence.

The initial substrate may be composed of a solid part supporting a structure composed of one or more films, in which the said film of solid material must be delimited. All or part of this structure may be obtained by epitaxy. This structure may be such that the remainder of the substrate, which may or may not be an epitaxy carrier, can be reused after the thin film has been transferred to transfer another thin film.

The layer of inclusions may be formed by a film deposition technique. It may then consist of generating columns or generating grains.

Inclusions may have a chemical affinity with the said gaseous compounds.

Inclusions may originate from a parametric mismatch between the material forming the inclusions layer and substrate regions adjacent to it. This parametric mismatch may consist of a change in the size of crystalline parameters, changes in the crystalline orientation along a plane parallel to the surface of the transferred structure, a difference in the coefficient of thermal expansion between one of the films and the initial material (and/or other films).

The inclusions layer may also be formed by a technique for etching a substrate layer.

The layer of inclusions may also be formed by the implantation of elements in a substrate layer. These elements may be implanted in one or several steps. Implantation of these elements may be assisted by heat treatment capable of increasing the efficiency of traps, this heat treatment possibly being done before, during and/or after implantation. This heat treatment may modify the morphology and/or composition of the inclusions, which encourages subsequent confinement of gaseous compounds. This heat treatment is done at a temperature and for a period such that it cannot be used to make a fracture over the entire inclusions layer.

The inclusions layer may also be obtained by heat treatment of the film(s) and/or by applying stresses to the film(s) in the film structure.

The inclusions layer may also be obtained by a combination of the different techniques mentioned above.

The gaseous compounds may be implanted by bombardment of the compounds chosen among neutral compounds and ions. It may also be done by a method chosen from plasma assisted diffusion, thermal diffusion and plasma assisted diffusion combined with thermal diffusion and/or assisted by electric polarization. Implantation may take place normal to the implanted surface of the substrate, or at a certain incidence. It may be done using rare gases, or other elements.

The process may comprise a heat treatment step capable of weakening the substrate at the inclusions layer to enable separation between the thin film and the remainder of the substrate. This heat treatment is applied with a given thermal budget which depends on the various thermal budgets used during the process. In particular, this heat treatment takes account of the temperature rise(s) induced by heat treatments in which thermodynamic equilibrium is not achieved, such as temperature rises resulting from the inclusions formation step and/or the step of implanting gaseous compounds and heat treatments involving heating or cooling of the substrate, for example such as for implantation, or reinforcement of the bond forces when gluing on a support. Therefore this heat treatment may be zero if the said weakening can be achieved by other steps in the process. It may be achieved by applying a positive temperature or a negative temperature. This weakening according to the invention is such that it enables separation of the thin film from the remainder of the substrate with or without the use of mechanical stresses. This heat treatment may be obtained by pulsed heating, for example in order to quickly increase the temperature. For example, this pulsed heating may be of the RTA (Rapid Thermal Annealing) or RTP (Rapid Thermal Process) type.

The process may also comprise a step in which the thin film delimited in the substrate is put into intimate contact with a support onto which the thin film will bond after it has separated from the remainder of the substrate. The film may be put into intimate contact directly (for example by wafer bonding) or through an added on material. A heat treatment step may be used to reinforce the bond between the thin film delimited in the substrate and the added on support.

Mechanical stresses may be exerted during and/or after and/or before the heat treatment, to contribute to separation between the thin film and the remainder of the substrate.

The process according to the invention is particularly suitable for the transfer of a thin silicon film from an initial substrate. It may also be applied for the transfer of a thin film made of a III-V semiconducting material (for example AsGa), from an initial substrate. The thin film may itself be composed of a thin film structure. It may have been at least partially treated before its transfer, to form, over all or part of the film to be transferred, an integrated circuit or to form, over all or part of the film to be transferred, an optoelectronic component on it.

BRIEF DESCRIPTION OF THE DRAWINGS

The invention will be better understood after reading the following description, given as a nonrestrictive example, accompanied by the attached drawings in which.

DETAILED DESCRIPTION OF EMBODIMENTS OF THE INVENTION

Figure 1:
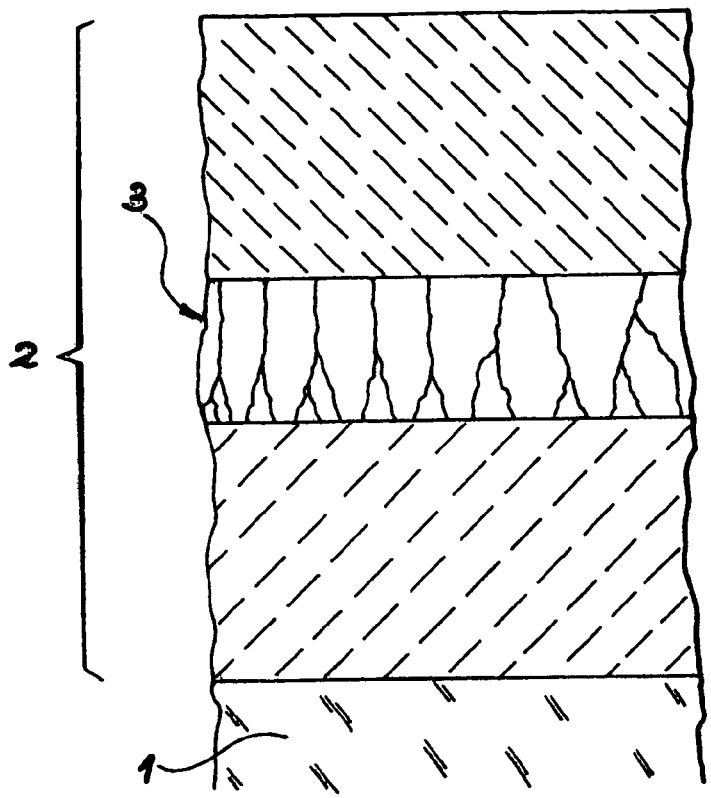
FIG. 1 is a cross-sectional view of a substrate formed on an initial support on which a sputtering technique is used to grow a film structure comprising a layer of inclusions due to columnary growth.

The substrate from which the thin film will be transferred may be a solid substrate (formed from a single material) or a composite substrate, in other words formed from films with identical or different chemical and/or physical natures.

Inclusions may be generated in the initial material, particularly by:
- a structural change in the initial material (crystalline structure, crystalline orientation, locally amorphous fields, missing material, etc.);
- a change in the physical nature (densification, inclusion of gas during production, implantation of various ions, ionic etching and/or selective chemical and/or electrochemical etching on several layers, etc.);
- a change in the chemical nature or chemical bonds (doping effect, composition variation effect, use of an interface of a previously glued structure, nucleation and/or growth of precipitates, etc.);
- more or less local material deformations (interface effects, effect of heat treatments on layers with different coefficients of expansion, effect of stresses generated between consecutive layers, etc.).

A number of techniques for preparation or treatment of materials in films can be used to make inclusions in a zone relatively parallel to the material surface.

For example, in terms of applications the advantage of this type of process is that it enables a substrate change for one or several stacked films, for a structure that is partially or completely treated in order to make a micro-electronic component, a sensor, etc. For example, this need may be very important in the case in which the transferred film or structure is to be subjected to heat treatments that the final support is unable to resist (excessive temperature, excessive difference in thermal expansion, etc.).

The various techniques for deposition of films can be used to make stacks of one or several films, in which the film composition, their stress, structure and morphology, can easily be varied. A film deposition means adding and/or making a film. These various possibilities can be used to generate inclusions in the initial material before the step in which gaseous compounds are implanted. Interfaces, film(s) and their neighborhood(s) concerned are subsequently considered as being a zone of inclusions, which act as traps for gaseous compounds implanted during the second step of the process.

There are many deposition techniques chosen as a function of the nature of the materials to be prepared. Materials may be amorphous, polycrystalline or monocrystalline. For some applications, deposits must be made by epitaxy (homogenous or heterogeneous). The most frequently used deposition techniques include depositions by ion sputtering, depositions by reaction in vapor phase at high or low pressure, assisted or not assisted by plasma, depositions by molecular jet, depositions by epitaxy in the liquid phase, depositions assisted by laser ablation.

The ion sputtering technique enables columnary growth with different orientations and sizes. These sizes and orientations can be controlled depending on the deposit pressure, temperature and energy conditions. In columnary growth, the growth of some of the columns is stopped to the benefit of other columns which get larger. For example, in the production of Co (Zr, Nb) films, an argon pressure of the order of 30 mTorrs during the deposition encourages columnary growth. This effect may be used to impose specific magnetic properties on the deposit with respect to the initial support plane. Zones at and/or near the end of the columns that have been stopped in their growth are exclusion zones.

FIG. 1 illustrates a substrate thus obtained. It is formed from an initial support 1, which may or may not be composite, on which a thin film structure 2 is grown by sputtering. A columnary growth was provoked inside structure 2 to build up a layer 3 of inclusions that will be used as a trap zone for the gaseous compounds to be implanted. The location of the fracture surface within or around the trap zone depends on the efficiency of the traps created.

This deposition technique can also produce growth in medium sized grains (mono-crystalline, polycrystalline or amorphous agglomerates) with very easily controllable dimensions. For example, if Tm is the melting temperature of the material to be deposited, a deposition temperature T such that the ratio T/Tm exceeds 0.5, encourages growth in crystalline grains. Further information about this subject is given in the article by A. G. DIRKS and H. J. LEAMY published in the Thin Solid Films journal, 47, 219 (1977). Joints between grains are also inclusion zones for the process according to this invention.

Figure 2:
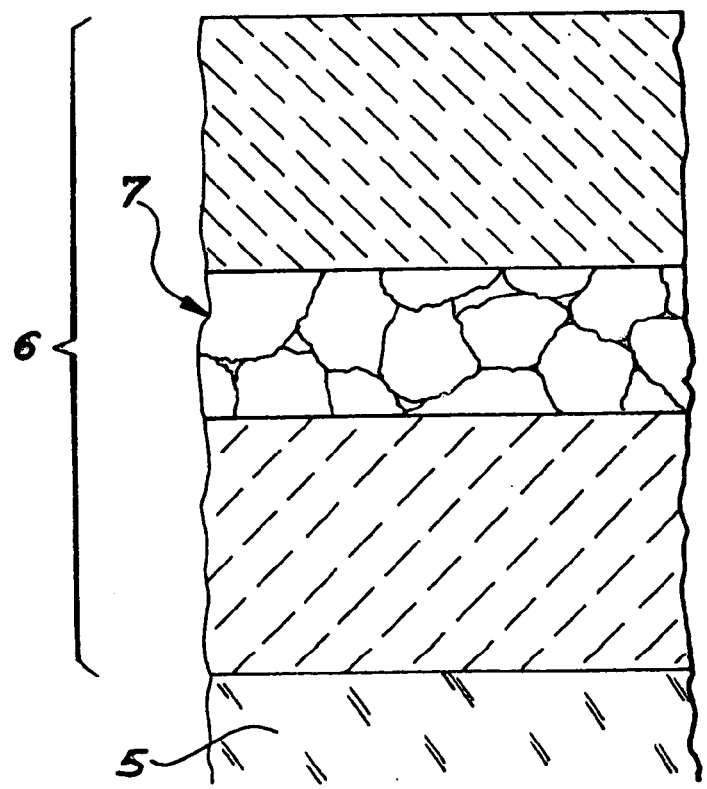
FIG. 2 is a cross-sectional view of a substrate formed on an initial support on which a sputtering technique is used to grow a film structure comprising a layer of inclusions due to granular growth.

FIG. 2 illustrates a substrate thus obtained. It is formed of a composite or non-composite initial support 5 on which a thin film structure 6 is grown by sputtering. Granular growth was provoked inside structure 6 to build up an inclusions layer 7 that will be used as a zone of traps for gaseous compounds to be implanted. The position of the fracture surface at the inclusions zone depends on the efficiency of the traps created.

In general, film deposition techniques can be used to obtain films with perfectly controllable thicknesses. It is then possible to make thin structures composed of single or multiple films. Film deposits are made without any crystalline relation (with the initial support and/or between films)

or in epitaxy (homogeneous or heterogeneous). Furthermore, the term film deposits must include deposits of multilayer films comprising buffer layers and/or seed layers, in order to form crystalline structures. Note that in the case of homogeneous epitaxy of a film on a support of the same nature, the interface (if it exists) may be the location of inclusions. Gaseous compounds subsequently implanted will be located at and/or near this interface.

These structures formed of one or more films occupy all or part of inclusion zones, given:
- the physical and/or chemical nature of the films (chemical interaction between films, variation in crystalline orientations in the case of multilayer structures, affinity for gaseous compounds that will be implanted later, etc.);
- the stresses present in these various films and interfaces generated (due to a mismatch of crystalline meshes, the difference in coefficients of thermal expansion, the interface micro-roughness, inclusions of elements other than elements of the material to be deposited, inclusions of heterogeneous phases, etc.).

For example, a multi-layer structure can be made in which at least one crystalline film is deposited, separated from the initial crystalline support by one or several films, called buffer and/or seed layers. The crystalline orientations in the crystalline film may be identical or different to the orientations of the initial support. The role of the buffer layers is to provoke variations in crystalline orientation over all or part of the surface of the platelet, particularly in the plane with respect to the initial support. In this case, a stress and/or dislocations zone is generated, which will be used to adapt crystalline meshes. This zone is located close to the films mentioned. For the deposition of superconducting YBaCuO films, it is thus made epitaxially on $SrTiO_3$ and/or $CeO_2$ buffer layers. These buffer layers are in epitaxy on a sapphire substrate in the R plane (1102). Mesh matching imposes a rotation of 45° of the type <001>crystalline axes in the plane, at the same time as a high stress close to interfaces or within the volume of the films mentioned. This 45° rotation may be eliminated in some zones by interposition of a very thin MgO film within these zones. Further information about this subject is described in the article "Bi-Epitaxial YBCO Grain Boundary Josephson Junctions on $SrTiO_3$ and Sapphire Substrates" by S. NICOLETTI et al, published in the Physica Journal C 269 (1996) 255–267.

Figure 3:
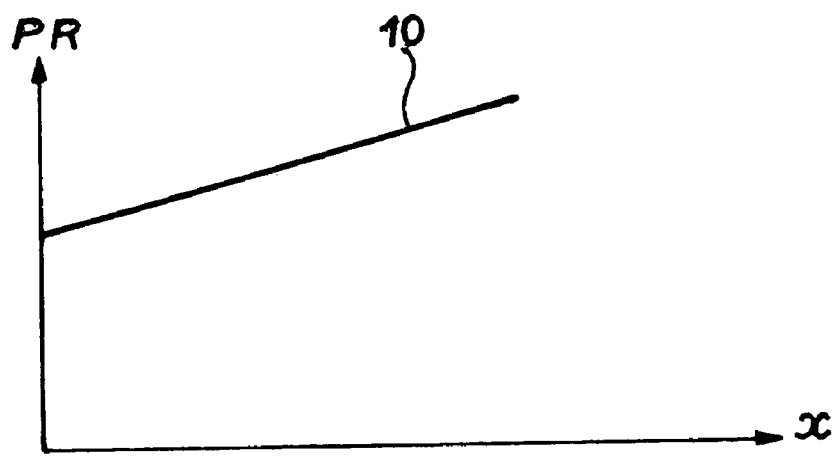
FIGS. 3 and 4 are diagrams showing the variation in the grid parameter of a crystalline composition as a function of the content of an element introduced in the composition.
Figure 4:
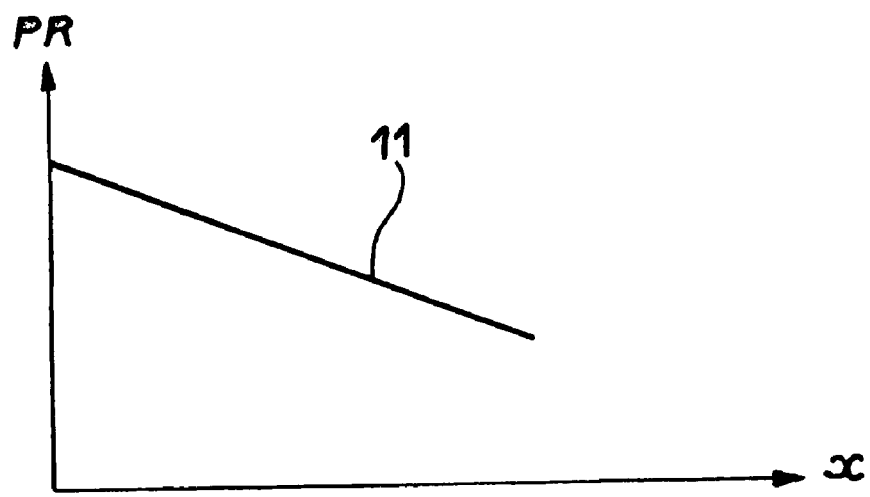

Another example related to stresses caused by mismatches between crystalline meshes would be chemical vapor phase depositions (CVD) of $Si_{(1-x)}Ge_x$ films on a silicon support. The stress will be controlled as a function of the concentration x of germanium in the film composition. FIG. 3 shows how the grid parameter PR varies as a function of the germanium concentration x in the composition. The slope of straight line 10 is equal to +0.022 nm depending on the atomic percentage of Ge. Another example is the effect of stresses related to the degree of doping in a silicon film (for example doping by boron at $10^{14}$ to $10^{20}$ atoms/$cm^3$) deposited on a slightly doped silicon board. FIG. 4 shows how the network parameter PR varies as a function of the concentration x of boron atoms as an atomic percentage. The slope of the straight line 11 is equal to −0.14 nm. We could also include the concept of inclusions by chemical nature. Thus a Ti film deposited on a silicon support and then covered with an encapsulating film maintains a strong sensitivity to any oxygen that may be present (the "getter" effect) and diffuses through the silicon at the time of a later heat treatment. The induced effect is to generate a stressed zone called the inclusions zone.

An example of the generation of stresses during film depositions is the use of deposition parameters such as the deposition pressure, the deposition temperature, the deposition power, the composition of the deposition atmosphere through the ratio of the partial pressures of carrier gases, neutral gases and reactive gases. It is known that stresses may create a state of high compression or high tension in the deposited films, depending on the film deposition pressure. The article by A. MATERNE et al. entitled "Changes in stress and Coercivity after Annealing of Amorphous Co (Zr, Nb) Thin Films Deposited by R. F. Sputtering", E.M.M.A. conf., Salford, United Kingdom, Sep. 14–16, 1987, contains further information about this subject. Thus, in the case of a deposition by cathodic sputtering of Co (Zr, Nb) films, a low pressure of the order of a few mTorrs will lead to a state of compression of the film, whereas a high pressure of the order of several tens of mTorrs will cause the same material to be in a state of tension. It has been determined by a chemical analysis that this variation is caused by the argon and oxygen density included in the film at the time of the deposit. The magnitude of the stresses is such that they can cause bond defects of films in limiting cases.

The term "film deposit" includes any heat and/or physicochemical treatment carried out before or after the deposition, in order to induce these effects in the deposited films.

Inclusions may also be generated by etching. Etching by a dry method (ionic, reactive ionic) and/or a "wet" chemical method (selective etching, anisotropic etching) and/or an electrochemical method can be used to make selected sizes of cavities open over a very small surface area. These cavities may or may not be filled in later with a trap material for the gaseous compounds necessary for the transfer.

Techniques for etching multi-layer structures may be used to generate inclusions, more or less assisted by partial masking techniques over all or some of the surface of the platelet (conventional techniques in microelectronics). Thus, it is possible to etch a grid of very small (submicronic) openings in a very thin surface film of silicon nitride. An insolation technique is used through a mask on a positive or negative resin film. In some zones, the resin film may then be withdrawn chemically by a developer adapted to the resin used. In these open zones, an etching technique using an accelerated ion beam, called ionic etching, can be used to make openings in the silicon nitride film. When this surface film is deposited on the surface of a silicon film, it then becomes possible to etch the silicon in line with the openings made, using tetramethylammonium hydroxide. This chemical etching is very selective to the extent that the silicon etching speed is more than 100 times greater than the nitride etching speed. It is then possible to make cavities larger than the openings generated in the nitride film.

Figure 5:
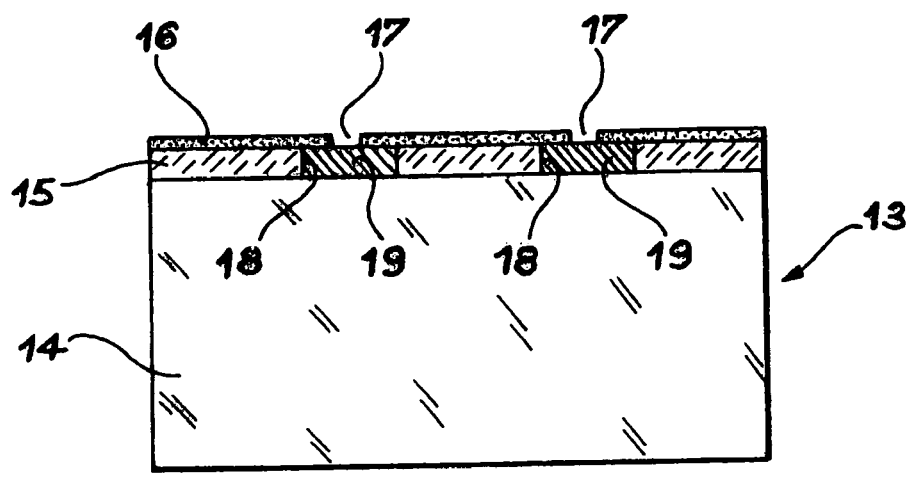
FIG. 5 is a cross-sectional view of a substrate on which inclusions are generated by etching.

FIG. 5 shows this type of embodiment. It illustrates a substrate 13 composed of an initial support 14 covered by a silicon film 15. The film 15 is coated with a very thin film of silicon nitride 16 in which small openings 17 are formed. Openings 17 were used to obtain cavities 18 in the silicon film 15. Depending on the dimension of the openings 17 made in the silicon nitride film 16 and the thickness of this film 16, it is possible to deposit a material 19 in cavities 18, the chemical nature of this material being favorable to trapping (for example titanium for its getter effect) gaseous compounds (for example oxygen) implanted during the later implantation step.

Subsequently, openings made by the deposit of a layer may be obstructed. This deposit is not always necessary, like for example in the case of a transfer of a structure of pads made in a crystalline silicon film. Similarly under some conditions, heat treatments under controlled atmosphere are used to facilitate closing some cavities, or even to close the cavities. In the process according to the invention, these etching zones will be considered as being inclusions, and traps for gaseous compounds implanted later.

Inclusions may also be generated by ion implantation.

Implantation by bombardment of neutral compounds or ions in a material can generate a layer rich in inclusions at a specific depth of the implanted element. For implanted compounds, electronic and nuclear retarding effects of the target material are then considered. In the process according to the invention, the initial material is considered to be the target material. The implantation process may be done in one or several implantations. These implantations may possibly be assisted during or between each implantation by heat treatment. The implanted compounds and associated defects will be found close to an average projected range Rp. Inclusions generated appear as a disorder at a small scale in the local order of the material. Their morphology and size may be modified by heat treatment and/or single and/or multiple implantation of the same or a different element.

For example, consider the production of a silicon on insulator (SOI) material using the SIMOX (Separation by IMplantation of OXygen) process. Implantation of oxygen at 120 keV is followed by heat treatment at high temperature (for example about 1300° C.) to modify the topology and morphology of the generated inclusions. The implantation of oxygen at a low dose (about $4.10^{17}$ $0^+/cm^2$) within a silicon board, can produce a thin oxide layer typically at a depth of 250 nm (typical thickness 80 to 100 nm). This layer is defective; it is more or less continuous (presence of silicon pipes) and it contains silicon islands (typical dimensions a few tens of nanometers), depending on the implanted dose. In this respect, refer to the article by B. ASPAR et al. entitled "Ultra Thin Buried Oxide Layers Formed by Low Dose SIMOX Processes", Proc. 6th International Conference on SOI Technology and Devices, Electroch. Soc., Vol 94–11 (1994) 62. Similarly, the interfaces of this oxide layer with the upper film are more or less rough depending on the imposed heat treatments. Typically, the interface roughness may be controlled within a range of a few tens of nanometers to a few nanometers, as described in the article entitled "Characterization by Atomic Force Microscopy of the SOI Layer Topography in Low-Dose SIMOX Materials" by C. GUILHALMENC et al., published in the Materials Science and Engineering journal B 46 (1997) 29–32. This implanted layer and its interfaces will be considered as being an inclusion zone, confinement zones for gaseous compounds implanted during the second step of the process according to the invention.

Heat treatments may also be used to generate inclusions in the initial material, support or in at least one of the layers of the film structure to be transferred.

For example for silicon, "high-low-high" heat treatments are used to precipitate oxygen present in the material at a specific depth. This depth is typically a few micrometers in the case of monocrystalline silicon obtained by Czochralski pulling. This is done by applying a temperature cycle typically consisting of a constant high temperature above 1000° C., followed by a constant low temperature below 900° C., and then another constant high temperature above 1000° C. An order of magnitude of the depth x can be evaluated starting from the diffusion equation $x \propto (Dt)^{1/2}$ where D is the coefficient of diffusion at the heat treatment temperature and t is the diffusion time at this temperature. This layer generated by heat treatments is considered as being an inclusion zone.

As another example, heat treatments are known to enable adaptation of the stress level in films deposited by any one of the methods mentioned above. Thus, a heat treatment above 500° C. for a silicon oxide film deposited by CVD, can reduce the compression stress, or cancel it entirely, or even transform it into a tension. [See A. SLINTANI et al., J. Appl. Phys. 51 (8), p 4197 (1980)]. This type of behavior is considered to be caused by the reactions of the oxide to water vapor. It may be interpreted as being a degassing effect or a densification effect. Similarly, a large thermal expansion between one of the films and the initial support (or the other films) can cause a high stress state and locally generate stress inclusions, which encourage trapping of gaseous compounds. For example, there is the case of the silicon film (100) prepared on a sapphire, R plane. Coefficients of expansion are of the order of $4.10^{-6}$/K and $9.10^{-6}$/K respectively. Since the stress is very localized within the thickness of films around the interface, this results in local deformation of the material. A zone disturbed in this way is considered as being an inclusions zone in the process according to the invention.

Another way of inducing a stress on a plane film structure is to deposit a very highly stressed film on the back surface of the initial support, enabling a morphological deformation (concavity or convexity). The film structure is then deformed. The locally stressed zone in the structure containing the film or films to be transferred in the process according to the invention, is an inclusions zone for gaseous compounds implanted later on.

The process according to the invention comprises a second step after the generation of inclusions in the material concerned. This second step consists of implantation of gaseous compounds (atoms, ions) at a depth close to the layer of inclusions generated in the previous step. These gaseous compounds are confined, by means of the presence of inclusions. They participate in nucleation and/or growth of the micro-cavities, micro-bubbles (or "platelets") necessary for the transfer fracture. This implantation may be achieved through the plane surface of the structure to be transferred by bombardment and/or by plasma assisted diffusion and/or by heat treatment and/or by electrical polarization.

In the case of implantation by bombardment (neutral compounds and/or ions), these gaseous compounds are implanted at the average projected range, Rp. This depth is characteristic of the implantation energy of the element implanted in a given target. Therefore, an implantation energy will be chosen such that the depth Rp corresponds to the level of the inclusions zone or is such that the depth is close to the zone of inclusions, a diffusion heat treatment then being used to allow the species implanted at the level of the inclusion zone to migrate. Gaseous compounds may or may not be rare gases such as H, F, He. They may be implanted at the same time or in sequence.

Figure 6A:
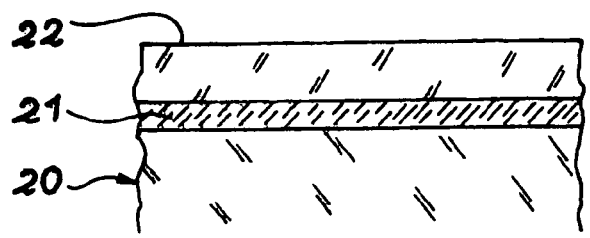
FIGS. 6A to 6D illustrate the process according to the invention in the case in which a thin film is transferred onto a stiffener.
Figure 6B:
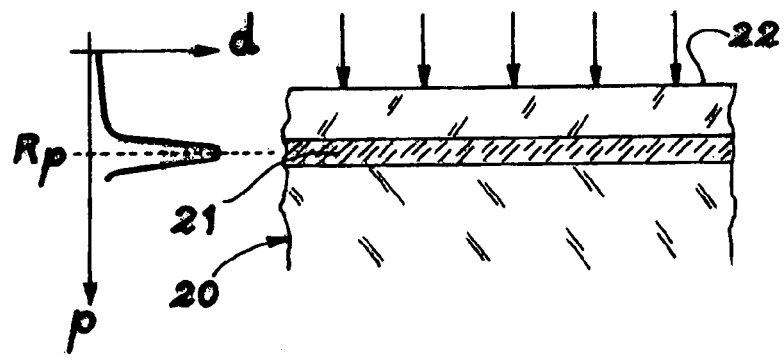
Figure 6C:
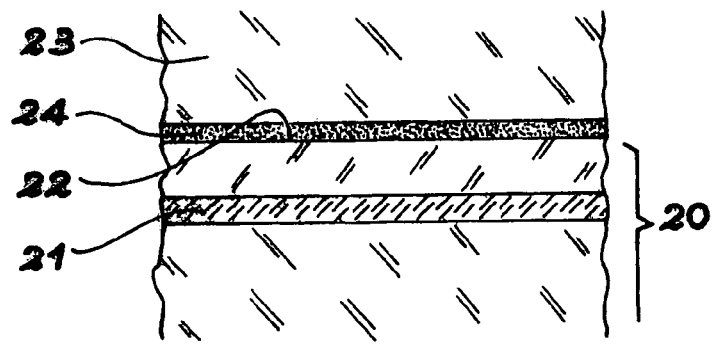
Figure 6D:
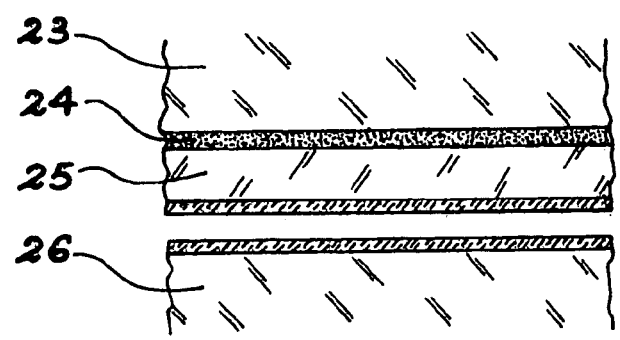

FIGS. 6A to 6D illustrate the process according to the invention in the case in which the thin film is transferred onto a stiffener. FIG. 6A shows a substrate 20 (for example formed of a structure of thin film(s) on an initial support), comprising an inclusions zone 21 formed by one of the methods described above. The inclusions zone is located at a distance from the surface 22 of the substrate corresponding to the thickness of the thin film to be transferred. FIG. 6B illustrates the ion implantation step. Gaseous compounds are implanted, for example by bombardment or diffusion, through the surface 22 of the substrate. The density d of gaseous compounds as a function of the depth p is such that their average projected range Rp corresponds to the inclusions zone 21 which becomes a trap zone with a high density of gaseous compounds. FIG. 6C illustrates a step in which the surface 22 of substrate 20 is bonded onto a stiffener 23 with the addition of an intermediate layer 24. Other techniques may also be used for bonding the surface 22 and the stiffener 23, without the addition of an intermediate layer. FIG. 6D illustrates the separation step subsequent to an appropriate heat treatment as a function of the required thermal budget as described above. In this figure, the separation fracture enters into the trap zone. Therefore, the initial substrate consists of a thin film 25 bonding to the stiffener 23 and a remaining part 26. The traps zone is shown in the diagram as consisting of two separate regions. However depending on the case, it may remain complete either by bonding to the thin film 25, or to the remaining part 26 of the substrate.

In the case of implantation by gaseous diffusion, the compounds may diffuse to a depth close to the depth of the inclusions, by adapting the diffusion time and temperature. Classical diffusion laws in $(Dt)^{1/2}$ are applicable to adapt the diffusion depth. Thus, a heat treatment under an argon and hydrogen atmosphere at a ratio of 9:1 (called the forming gas) enables hydrogen diffusion in silicon at about 350° C.

Regardless of the implantation method, the quantity of implanted gaseous compounds must be sufficient to participate in nucleation and/or development of micro-cavities, micro-bubbles (or platelets) starting from and near by the inclusions described above. Implantation conditions (dose, energy, target temperature, implantation time) depend particularly on:

the initial material (target),
the nature and location of inclusions,
the thermal budget supplied by the implantation,
the nature of the implanted gaseous compounds,
the thermal budget supplied subsequent to gluing (if any),
the thermal (energy) budget supplied by the weakening heat treatment,
any mechanical stresses.

However, implanted doses must be less than the maximum dose determined by the occurrence of exfoliation in the material during implantation. The efficiency of inclusions is defined by their confinement power on the gaseous compounds necessary for the transfer, considering the concentration of these compounds close to the inclusions.

In the case of ion implantation, this effect is illustrated by a reduction in the width of the implantation profile due to a higher concentration of implanted compounds around the implantation Rp. For example, consider a structure to be transferred composed of a 0.4 .mu.m thick $SiO_2$ film generated on a silicon support. A first ion implantation of hydrogen equal to $3.10^{16}$ $H^+/cm^2$ with an energy of 100 keV designed to generate inclusions, will result in a concentration of hydrogen at the average depth of 0.9 .mu.m. A heat treatment is carried out typically at about 350.degree. C. for 2 hours, and is designed to modify the morphology of the inclusions (micro-cavities). It is found that the layer containing the cavities is thinner than if the implantation had been done with a higher dose as in the case of the process disclosed by document FR-A-2 681 472. The inclusions zone corresponds to this layer of growing micro-cavities. A second implantation of $2.10^{16}$ $H^+/cm^2$ will be sufficient to enable a fracture close to this inclusions zone during separation heat treatments, for example at 500.degree. C. for 1 hour.

It is very easy to understand the advantage of confinement and possible location of micro-cavities, micro-bubbles (or platelets) over a very small thickness due to the thickness of the inclusions zone made and/or the film structure used. Similarly, the roughness of the fracture surface will also be reduced due to confinement of the inclusions and therefore the fracture zone.

In general, it is then possible to reduce the dose to be implanted necessary for nucleation and/or development of micro-cavities and/or reduce the forces to be exerted and/or reduce the energy budget of the heat treatment to induce fracture.

The transfer process designed to obtain a final film structure on a support assumes that the initial material is added onto a second support during a third step. The contact is made directly by wafer bonding, or through a bond layer. It must enable the final support to act as a stiffener. In both types of contact (direct and indirect), a fixation step may be necessary using a low temperature heat treatment. This treatment must be adapted so that it does not prevent micro-cavity and fracture growth mechanisms in the initial material. It will have to be taken into account in the thermal budget necessary to induce the fracture during a fourth step in the process. If the structure to be transferred is sufficiently stiff and/or thick and this step is not necessary, a "self-supported" structure will be obtained during the transfer.

Thus, in the example of a structure covered with an $SiO_2$ film to be transferred to a silicon support, a temperature of the order of 200° C. will be sufficient to reinforce the wafer bond. The gluing energy between the oxide film and the silicon support will exceed 0.3 $J/m^2$.

The fourth step in the process for transferring film structures requires a heat treatment for which the time and temperature are defined, particularly as a function of the efficiency of the inclusions created, the dose of implanted gaseous compounds, thermal conditions for implantation of the initial material, and thermal conditions for bonding to the final support plate. The heat treatment must be sufficient to cause a fracture in the initial material. This thus provokes separation of an unused part of the initial material from the film structure in contact with the final support. This separation takes place close to the layer of trapped compounds. Under the conditions according to the invention, the film structure (single layer or multi-layer) may be transferred with a lower fracture thermal budget than thermal budgets necessary in the process according to prior art. In defining the separation thermal budget, it is necessary to take account of the efficiency of the generated inclusions and the global thermal budget that is input to plates during the various steps of the process, namely during generation of inclusions, implantation and bond of the initial material on the stiffening support.

Furthermore, part of the energy necessary for the transfer of structures may be input by heat treatment and/or by means of stresses, for example related to a final support stiffening effect, related to the application of shear, bending, tension or pressure stresses, applied alone or in combination. The effect is of the same nature as that described in document FR-A-2 748 851. In this case, the minimum dose of gaseous compounds to be implanted during the second step of the process is the dose above which there is sufficient creation and/or growth of micro-cavities to induce sufficient weakening of the platelet parallel to the surface.

Figure 7:
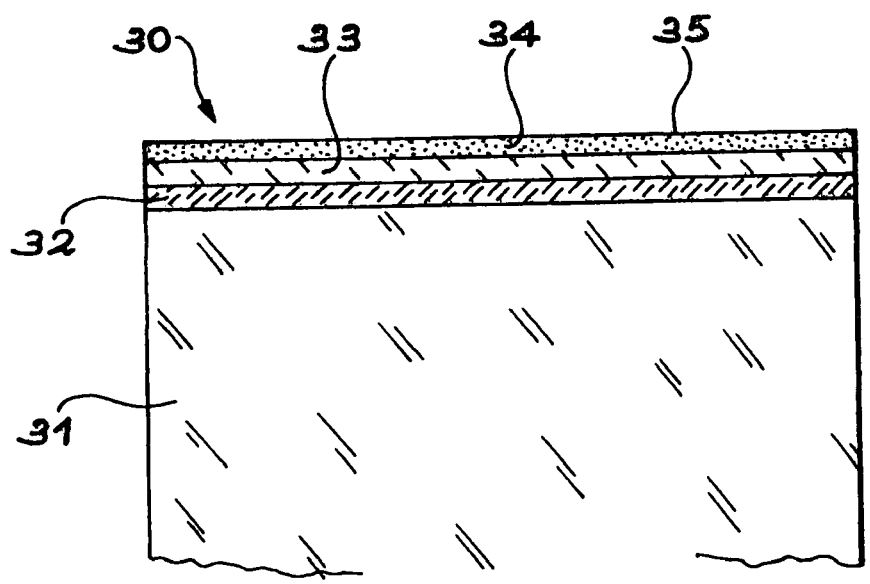
FIG. 7 is a cross-sectional view through a substrate that can be used to obtain an SOI structure using the process according to the invention.

FIG. 7 illustrates an application of the process according to the invention when an SOI structure is obtained. The initial substrate 30 is formed starting from a silicon platelet 31 on a face on which a silicon film 32 about 50 nm thick is deposited, strongly doped (about $10^{19}$ atoms/$cm^3$) by boron produced by epitaxy. The film 32 is itself covered with a silicon film 33 about 350 nm thick, slightly doped (about $5.10^{15}$ atoms/cm$^3$) by boron and also produced by epitaxy. Finally, the film 33 is coated with an SiO$_2$ film 34 about 400 nm thick and with a free surface 35. The highly doped silicon film 32 will act as the inclusions zone.

The substrate 30 is then submitted to the gaseous compound implantation step through surface 35. Hydrogen is implanted at a dose of $5.10^{16}$ atoms/cm$^2$, at an energy of 80 keV and at ambient temperature.

The surface 35 is then made to bond to a silicon plate by wafer bonding reinforced by heat treatment at 250° C. for 30 minutes.

The step in which the initial of substrate 30 is separated into two parts comprises a heat treatment, the efficiency of the heat treatment with respect to the fracture being adapted by the thermal budget (duration and temperature of the various heat inputs) This final heat treatment induces a fracture in the initial substrate, at and/or close to the film 32. The final heat treatment may typically be 2 hours at 250° C.

It is thus possible to obtain a structure formed of a slightly doped silicon film (film 33 in the initial substrate) on a silicon oxide layer (film 34 in the initial substrate), which is attached to a silicon mass. The highly doped silicon film 32 was used for confinement of the fracture.

The process according to the invention is particularly attractive for the transfer of structures in which one or several films must not be subjected to heat treatment at a temperature as high as the temperature involved in the process disclosed in document FR-A-2 681 472. The process is also useful in the case in which the structure to be transferred is composed of materials with different coefficients of thermal expansion.

Finally, it is important to note the following advantage of the process according to the invention. The surface of the transferred film structure is a disturbed zone obtained during the fracture. The thickness of this disturbed zone may be very small due to the use of a layer at and/or close to the inclusions to confine the dose of implanted gaseous compounds. This thus gives a low surface roughness of the transferred structure, since it is directly related to the distribution of micro-cavities or micro-bubbles within the thickness of the material during the transfer.

The invention claimed is:

1. A process for forming a thin film of material from a substrate, the process comprising the steps of:
   (a) introducing a first species of gaseous compounds to form a buried confinement layer at a distance from a surface of the substrate, wherein the confinement layer comprises a trap zone for a second species of gaseous compounds;
   (b) introducing the second species of gaseous compounds into the substrate, at a mean depth substantially within or in proximity to the confinement layer, thereby inducing a layer of micro-cavities along a fracture plane, wherein the confinement layer reduces the thickness of the layer of micro-cavities as compared to the thickness in the absence of the confinement layer; and
   (c) separating and recovering the thin film from the substrate along the fracture plane.

2. The process according to claim 1, wherein introducing the second species of gaseous compounds comprises implanting the second species of gaseous compounds into the substrate at a mean depth of penetration corresponding to a depth of the confinement layer.

3. The process according to claim 1, wherein introducing the second species of gaseous compounds comprises implanting the second species of gaseous compounds into the substrate at a mean depth of penetration close to the confinement layer, and wherein the process further comprises the step of heat treating the substrate following implantation of the second species of gaseous compounds so as to cause migration of the second species of gaseous compounds to the confinement layer.

4. The process according to claim 1, wherein the substrate comprises a main part that supports a film structure in which the thin film is delimited.

5. The process according to claim 4, wherein all or part of the film structure is formed by a process comprising epitaxial growth.

6. The process according to claim 1, wherein a main part of the substrate comprises a reusable substrate.

7. The process according to claim 1, wherein the second species of gaseous compounds has a chemical affinity with the first species of gaseous compounds.

8. The process according to claim 4, wherein introducing a first species of gaseous compounds comprises implantation of neutral compounds in a layer of the substrate.

9. The process according to claim 7 further comprising the step of heat treating the substrate so as to increase trapping efficiency of the second species of gaseous compounds.

10. The process according to claim 7 further comprising the step of heat treating the substrate so as to modify morphology of the confinement layer.

11. The process according to claim 1, wherein introducing the second species of gaseous compounds comprises bombardment of neutral compounds or ions.

12. The process according to claim 1, wherein introducing a first species of gaseous compounds comprises one of a) implantation by plasma assisted diffusion, b) thermal diffusion, or c) plasma assisted diffusion combined with thermal diffusion or d) diffusion assisted by electrical polarization, or e) plasma assisted diffusion combined with thermal diffusion and diffusion assisted by electrical polarization.

13. The process according to claim 1 further comprising a heat treatment step for weakening the substrate at the confinement layer so as to facilitate separation between the thin film and a remainder of the substrate.

14. The process according to claim 1 further comprising a step of placing the thin film in intimate contact with a support to which the thin film will bond after separation from a remainder of the substrate.

15. The process according to claim 14, wherein placing the thin film in intimate contact with a support comprises bonding the thin film to the support.

16. The process according to claim 13, wherein the heat treatment step comprises pulse heating.

17. The process according to claim 1, wherein separating the thin film from the substrate comprises applying mechanical stress.

18. The process according to claim 1, wherein forming a thin film of material from a substrate comprises forming a thin film of material from a silicon substrate.

19. The process according to claim 1, wherein forming a thin film of material from a substrate comprises forming a thin film of material from a III-V semiconducting material.

20. The process according to claim 1, wherein forming a thin film of material from a substrate comprises forming a thin film of material from a structure comprising thin films.

21. The process according to claim 1 further comprising the step of at least partially treating the thin film before separating the thin film from the substrate to form an integrated circuit on all or part of the thin film.

22. The process according to claim 1 further comprising the step of at least partially treating the thin film before separating the thin film from the substrate to form an optoelectronic component on all or part of the thin film.

23. A process for forming a thin film of material from a substrate, comprising the steps of:
(a) forming a gaseous compound trap zone at a depth in the substrate corresponding to a required thickness of the thin film, wherein the gaseous compound trap zone is defined by a parametric mismatch between a material comprising the gaseous compound trap zone and adjacent regions of the substrate;
(b) introducing into the material, a dose of gaseous compounds sufficient to cause formation of microcavities in a fracture plane along which the thin film can be separated from the remainder of the substrate, wherein the introduction of gaseous compounds comprises a step of implantation of the gaseous compounds; and
(c) separating and recovering the thin film from the substrate along the fracture plane by placing a support in intimate contact with the substrate such that the thin film bonds to the support.

24. The process according to claim 4, wherein introducing a first species of gaseous compounds comprises implantation of ions in a layer of the substrate.

25. The process according to claim 1, wherein the second species of gaseous compounds comprises implantation of a rare gas.

26. The process according to claim 1, wherein introducing a first species of gaseous comprises implantation of boron and introducing the second species of gaseous compounds comprises implantation of hydrogen.

* * * * *

UNITED STATES PATENT AND TRADEMARK OFFICE
CERTIFICATE OF CORRECTION

| | |
|---|---|
| PATENT NO. | : 7,229,899 B2 |
| APPLICATION NO. | : 10/667707 |
| DATED | : June 12, 2007 |
| INVENTOR(S) | : Hubert Moriceau et al. |

It is certified that error appears in the above-identified patent and that said Letters Patent is hereby corrected as shown below:

<u>On the Title Page</u>

In column 1, item (75), after "Maleville," delete "La Terrase" and substitute --La Terrasse-- in its place.

In column 1, line 2, under "Related U.S. Application Data", delete "Dec. 29, 1998" and substitute --Nov. 22, 1999-- in its place.

Page 2, in column 1, line 9, under "U.S. PATENT DOCUMENTS", immediately after "5,854,123 A" insert --*--.

Page 2, in column 1, line 12, under "U.S. PATENT DOCUMENTS", immediately after "5,920,764 A" insert --*--.

Page 2, in column 1, line 14, under "U.S. PATENT DOCUMENTS", immediately after "5,966,620 A" insert --*--.

Page 2, in column 1, line 15, under "U.S. PATENT DOCUMENTS", immediately after "5,993,677 A" insert --*--.

Page 2, in column 1, line 17, under "U.S. PATENT DOCUMENTS", immediately after "6,013,563 A" insert --*--.

Page 2, in column 1, line 18, under "U.S. PATENT DOCUMENTS", immediately after "6,020,252 A" insert --*--.

Page 2, in column 1, line 21, under "U.S. PATENT DOCUMENTS", immediately after "6,071,795 A" insert --*--.

Page 2, in column 1, line 22, under "U.S. PATENT DOCUMENTS", immediately after "6,103,597 A" insert --*--.

Page 2, in column 1, line 23, under "U.S. PATENT DOCUMENTS", immediately after "6,103,599 A" insert --*--.

Page 2, in column 1, line 27, under "U.S. PATENT DOCUMENTS", immediately after "6,190,998 B1" insert --*--.

Page 2, in column 1, line 28, under "U.S. PATENT DOCUMENTS", immediately after "6,225,190 B1" insert --*--.

UNITED STATES PATENT AND TRADEMARK OFFICE
CERTIFICATE OF CORRECTION

PATENT NO. : 7,229,899 B2
APPLICATION NO. : 10/667707
DATED : June 12, 2007
INVENTOR(S) : Hubert Moriceau et al.

It is certified that error appears in the above-identified patent and that said Letters Patent is hereby corrected as shown below:

On the Title Page (cont'd)

Page 2, under "FOREIGN PATENT DOCUMENTS" insert the following:
--WO 2004/044976    5/2004--.

Page 2, in column 2, line 6, under "OTHER PUBLICATIONS", delete "implatation" and substitute --implantation-- in its place.

Page 2, in column 2, line 13, under "OTHER PUBLICATIONS", delete "Implated" and substitute --Implanted-- in its place.

Page 3, in column 2, line 1, delete "Implatation" and substitute --Implantation-- in its place.

Page 3, in column 2, line 6, delete "Pattern-Implated" and substitute --Pattern-Implanted-- in its place.

In the Claims

Column 16, in claim 26, line 2, after "species of gaseous" insert --compounds--.

Signed and Sealed this

Twenty-third Day of October, 2007

JON W. DUDAS
*Director of the United States Patent and Trademark Office*